(12) United States Patent
Fraleigh et al.

(10) Patent No.: US 6,452,524 B1
(45) Date of Patent: Sep. 17, 2002

(54) DELTA SIGMA CONVERTER INCORPORATING A MULTIPLIER

(75) Inventors: Stephen Fraleigh, Raleigh, NC (US); Douglas A. Cairns, Durham, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/779,234

(22) Filed: Feb. 8, 2001

(51) Int. Cl.$^7$ ................................................. H03M 3/00
(52) U.S. Cl. ........................................ 341/143; 341/155
(58) Field of Search ................................ 341/143, 144, 341/155, 120; 343/394; 328/155

(56) References Cited

U.S. PATENT DOCUMENTS

| | | | | |
|---|---|---|---|---|
| 4,086,539 A | * | 4/1978 | Gustafson et al. | 328/155 |
| 4,562,437 A | * | 12/1985 | Sasaki et al. | 343/394 |
| 5,087,914 A | | 2/1992 | Sooch et al. | 341/120 |
| 5,187,482 A | * | 2/1993 | Tiemann et al. | 341/143 |
| 5,276,764 A | | 1/1994 | Dent | 395/2 |
| 5,583,501 A | | 12/1996 | Henrion et al. | 341/118 |
| 5,727,023 A | | 3/1998 | Dent | 375/244 |
| 6,313,775 B1 | * | 11/2001 | Lindfors et al. | 341/143 |

* cited by examiner

*Primary Examiner*—Peguy Jeanpierre
*Assistant Examiner*—Joseph Lauture
(74) *Attorney, Agent, or Firm*—Coats & Bennett, P.L.L.C.

(57) ABSTRACT

A delta-sigma converter including a multiplier. The delta-sigma converter includes a feed-forward path and a feedback path providing a feedback signal. The converter output signal is multiplied in the feedback path by a mapping function, and the multiplied signal is mapped to a digital feedback signal having the same number of bits as the input signal. There is also provided a digital-to-analog converter including a delta-sigma converter consistent with the invention, and a method of multiplying a digital signal.

28 Claims, 2 Drawing Sheets

DELTA SIGMA CONVERTER INCORPORATING A MULTIPLIER

BACKGROUND OF THE INVENTION

The present invention relates to digital-to-analog converters, and, more particularly, to a delta-sigma digital-to-analog converter incorporating a multiplication function.

Digital-to-analog (D/A) and analog-to-digital (A/D) converters are widely used for converting electrical signals between digital and analog formats. Communication systems, for example, typically require extensive D/A and A/D conversion for performing a variety of signal processing functions. These converters may be implemented on an integrated circuit, such as an application specific integrated circuit (ASIC).

In an ASIC implementation, a converter may be combined with several other signal processing functions for performing the desired ASIC function. One common function implemented on such an ASIC is a multiplier function. There are several known techniques for providing a multiplier on an ASIC. While implementation of a multiplier is well understood and standard multiplier fabrication methods exist, the multiplier typically requires a relatively large area of the semiconductor chip on which the ASIC is formed. As a result, the multiplier typically consumes a significant amount of power.

BRIEF SUMMARY OF THE INVENTION

A delta-sigma converter consistent with the invention includes a feed-forward path for receiving a feed-forward signal and providing an output signal; and a feedback path comprising a multiplying mapping function. The mapping function is configured to multiply the output signal based on at least one multiplication factor and to provide a feedback signal representative of the multiplied output signal. The feedback signal is combined with an input signal to provide the feed-forward signal. A method of multiplying a digital signal consistent with the invention includes coupling the digital signal as the input signal to a delta-sigma converter consistent with the invention.

A digital-to-analog converter consistent with the invention includes a delta-sigma converter configured to provide a digital output signal representative of an N-bit digital input signal multiplied based on at least one multiplication factor; and a digital to analog converter for providing an analog output signal representative of the digital output signal.

BRIEF DESCRIPTION OF THE DRAWING

Advantages of the present invention will be apparent from the following detailed description of exemplary embodiments thereof, which description should be considered in conjunction with the accompanying drawings, in which.

DETAILED DESCRIPTION OF THE INVENTION

Figure 1:
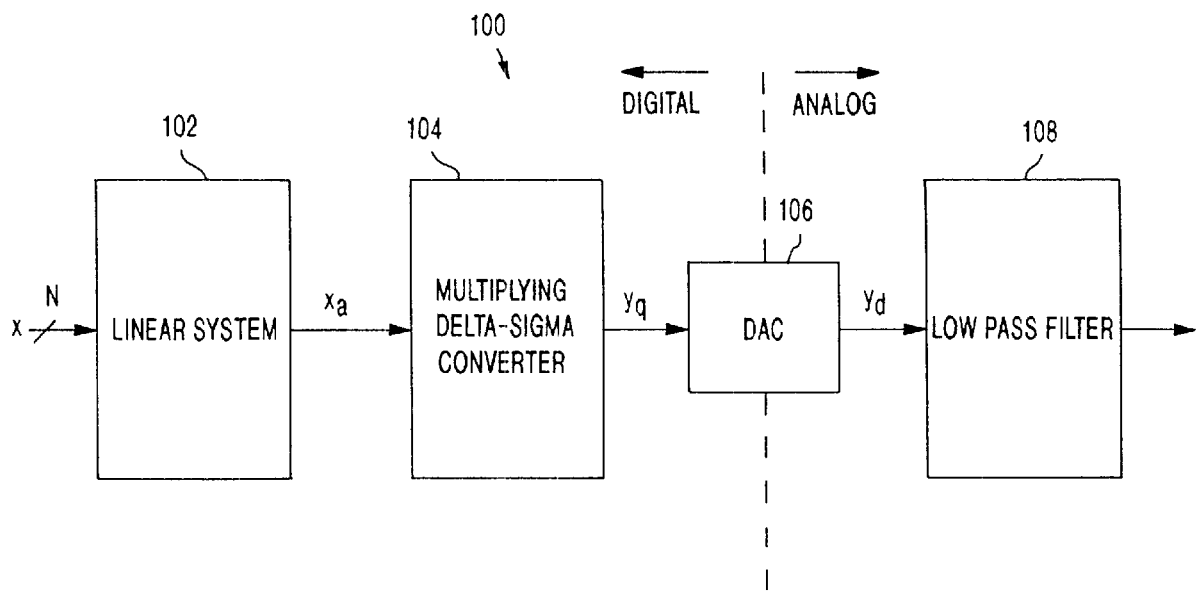
FIG. 1 illustrates an exemplary digital-to-analog converter consistent with the invention.

With reference now to FIG. 1, there is illustrated an exemplary digital-to-analog converter 100 consistent with the invention. Those skilled in the art will recognize that a converter consistent with the invention may be incorporated into a variety of systems for achieving D/A conversion. A converter consistent with the invention may, for example, be provided in transmitters and receivers for a communication network, including wire-based and cellular or wireless networks using air interfaces, such as GSM, TDMA, CDMA or FDMA.

As shown, a D/A converter 100 consistent with the invention may include: a linear system 102 for receiving a multi-bit input signal x, i.e. a stream of digital words having a word length N; a multiplying delta-sigma converter 104 for receiving the output $x_a$ of the linear system; a digital-to-analog converter (DAC) 106 for receiving the output $y_q$ of the delta-sigma converter; and a low-pass filter 108 for receiving the output $y_d$ of the DAC. With the exception of the multiplying delta-sigma converter, the illustrated converter 100 includes elements conventionally provided in a delta-sigma-type D/A converter. A variety of configurations for the linear system 102, the DAC 106, and the low pass filter 108 will, therefore, be known to those skilled in the art.

The linear system 102 may, for example, be a conventional interpolator for changing the data rate of the incoming digital signal x and suppressing spectral replicas of the data in the frequency domain. In a case where an interpolator is not required, however, the linear system may simply comprise a direct connection of the digital input to the multiplying delta-sigma converter. In a known manner, a feed-forward path of the delta-sigma converter shortens the input word length, e.g. to a single bit, such that the quantization noise introduced by this process is outside of the signal baseband. As will be described in greater detail below, the delta-sigma converter is also configured to multiply the digital signal, thereby eliminating the need for a separate dedicated multiplier circuit.

The DAC 106, typically a one-bit DAC, may be of conventional construction and coupled to the output of the delta-sigma converter 104. The output $y_d$ of the DAC 106 is an analog representation of the digital input signal $y_q$, including an amount of noise resulting from quantization error introduced by the delta-sigma converter. The noise may be significantly suppressed by the conventional low-pass filter 108 to provide an analog output y.

Figure 2:
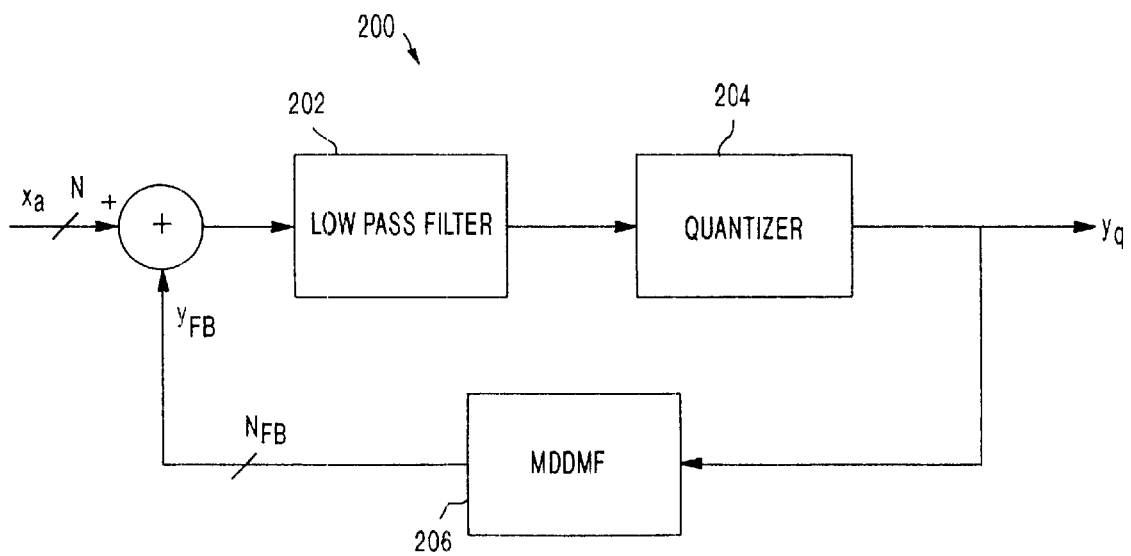
FIG. 2 illustrates an exemplary delta-sigma converter consistent with the invention.

Turning now to FIG. 2, there is illustrated a block diagram of an exemplary multiplying delta-sigma converter 200 consistent with the invention. In general, the converter 200 incorporates a multiplying mapping function in the feedback path of a known delta-sigma converter configuration. For simplicity and ease of explanation, the present invention will be described herein in connection with a first-order delta-sigma converter configuration. It is to be understood, however, that the present invention is equally applicable to higher order delta sigma converters. Those skilled in the art will also recognize that the present invention is applicable to multi-bit, as well as single-bit, delta sigma converters.

In the illustrated exemplary embodiment, the converter 200 has a feed-forward path including a low pass filter 202 and a quantizer 204, and a feedback path including a multiplying digital-to-digital mapping function (MDDMF) 206. The low pass filter 202 may be provided in a variety of known configurations, and is typically an integrator. The output of the low-pass filter 202 is provided to the quantizer 204, which also has a known configuration. The quantizer is typically a two-level quantizer, but may be a multi-level quantizer. The quantized output $y_q$ is provided as the converter output and is fed back to the MDDMF 206.

In a manner to be described in more detail below, the MDDMF 206 is configured to map the quantized output, typically one bit, to a full-scale digital signal $y_{FB}$ representing the value of the quantized output. The signal $y_{FB}$ may have a word size, $N_{FB}$, of at least the same number of bits, N, as the input signal $x_a$. The MDDMF 206 also multiplies the quantized output based on a predetermined multiplication factor. The feedback signal $y_{FB}$ is combined with the input signal $x_a$. This feedback through the MDDMF 206 forces the average value of the quantized output $y_q$ to track the average value of the input signal $x_a$ multiplied by the predetermined multiplication factor.

Figure 3:
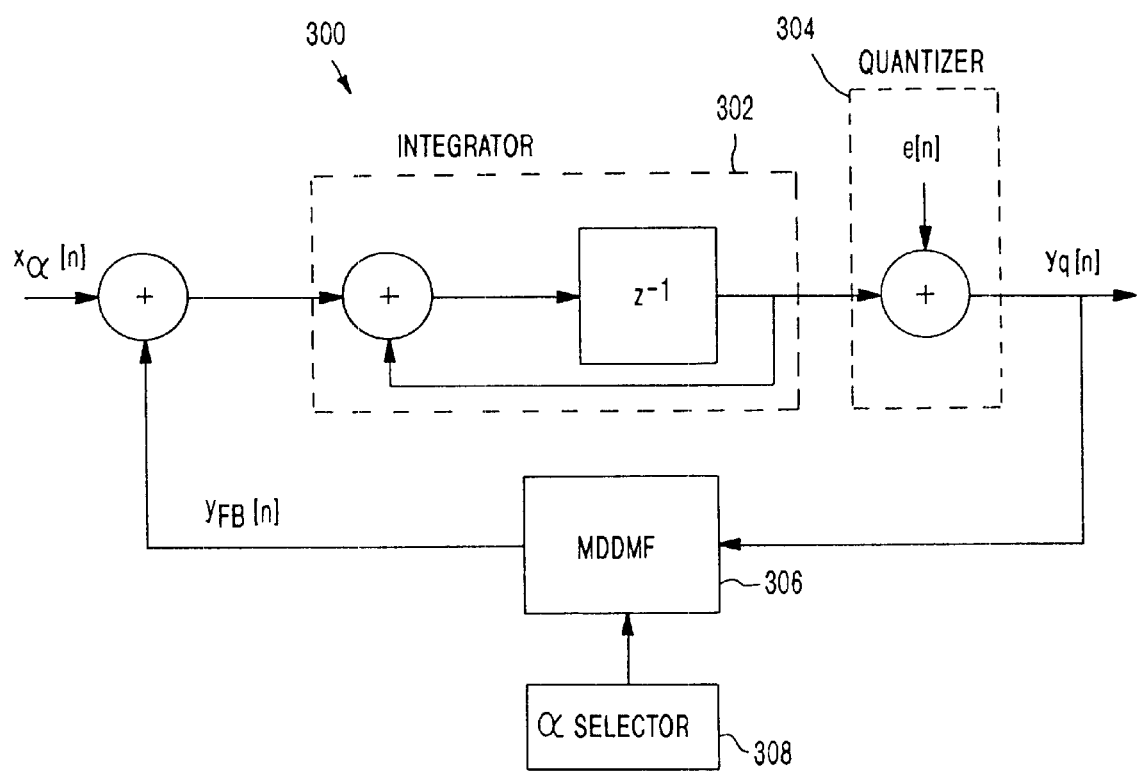
FIG. 3 illustrates a sampled-data equivalent circuit for an exemplary delta-sigma converter consistent with the invention.

The operation of the MDDMF will be described in greater detail in connection with FIG. 3, which illustrates the sampled-data equivalent circuit for an ASIC implementation of an exemplary delta-sigma converter 300 consistent with the invention. As shown, the feed-forward section of the converter includes a discrete time integrator 302 and a quantizer 304 that introduces quantization error e[n]. The integrator 302 and the quantizer 304 function in a known manner.

In the illustrated embodiment, the MDDMF 306 maps the quantizer output $y_q$ to a full-scale digital feedback signal $y_{FB}[n]$ having the same number of bits as the input, e.g. a one bit quantizer output $y_q$ may be mapped to a 12-bit feedback value $y_{FB}[n]$. The MDDMF 306 also multiplies the quantizer output $y_q$ based on a predefined multiplication factor $\alpha$. Consistent with the present invention, the MDDMF 306 may be implemented as a lookup table indexed by the quantizer output $y_q[n]$. For example, in an exemplary embodiment $y_{FB}[n]$ may be expressed as:

$$y_{FB}[n] = \begin{cases} \dfrac{2^{N-1}}{\alpha} & \text{if } y_q[n] = 1 \\ \dfrac{-2^{N-1}}{\alpha} & \text{if } y_q[n] = 0 \end{cases}$$

where $y_{FB}[n]$ is the $N_{FB}$-bit feedback value at a discrete time n, $y_q[n]$ is the quantizer output, and $\alpha$ is the desired multiplication factor. A delta sigma converter consistent with the invention may thus be implemented for effecting both a D/A conversion and a digital multiplication through use of an appropriate MDDMF in the converter feedback path.

The multiplication factor a may be a single static value. It is to be understood, however, that a converter consistent with the invention may be configured to implement multiple and/or programmable values for $\alpha$. In the case of programmable values, the mapping circuit may be configured to receive an input from an a selector 308 for defining one or more values for $\alpha$. The selector may be integral with an IC on which the converter is implemented or may comprise an external connection. Those skilled in the art will recognize that a variety of configurations may be provided to manage multiple static or programmable a values. For example, lookup tables may be constructed for $\alpha_0, \alpha_1, \ldots \alpha_n$ and concatenated to form one large lookup table.

Those skilled in the art will also recognize that delta-sigma converters may produce artifacts if overdriven, i.e. if $x[n] > y_{FB}[n]$. In the illustrated exemplary embodiment, to avoid such artifacts a may be selected such that $0 < \alpha \leq 1$. For all values of $\alpha < 1$, the number of bits $N_{FB}$ will exceed N. The summing junction, the feedback path and the internal feed-forward paths should be configured to accommodate the worst case of the digital feedback word size.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention.

What is claimed is:

1. A delta-sigma converter comprising:
   a feed-forward path for receiving a feed-forward signal and providing an output signal; and
   a feedback path comprising a multiplying mapping function,
   said mapping function being configured to multiply said output signal based on at least one multiplication factor and provide an $N_{FB}$-bit feedback signal representative of said multiplied output signal, said feedback signal being combined with an N-bit input signal to provide said feed-forward signal.

2. A delta-sigma converter according to claim 1, wherein said mapping function is configured to provide said feedback signal in accordance with:

$$y_{FB}[n] = \begin{cases} \dfrac{2^{N-1}}{\alpha} & \text{if } y_q[n] = 1 \\ \dfrac{-2^{N-1}}{\alpha} & \text{if } y_q[n] = 0 \end{cases}$$

where $y_{FB}[n]$ is a value of said feedback signal at a discrete time n, $y_q[n]$ is a value of said output signal at said discrete time n, and a is said at least one multiplication factor.

3. A delta-sigma converter according to claim 2, wherein $0 < \alpha \leq 1$.

4. A delta-sigma converter according to claim 1, wherein said at least one multiplication factor is a programmable value.

5. A delta-sigma converter according to claim 1, wherein said output signal is a single-bit output signal.

6. A delta-sigma converter according to claim 1, wherein said feed-forward path comprises a low pass filter and a quantizer, said low pass filter for receiving said feed-forward signal and having an output coupled to an input of said quantizer, said quantizer being configured to provide said output signal.

7. A delta-sigma converter according to claim 6, wherein said low pass filter comprises an integrator.

8. A delta-sigma converter comprising:
   a feed-forward path comprising a low pass filter for receiving a feed-forward signal and a quantizer coupled to an output of said low pass filter, said quantizer being configured to provide an output signal; and
   a feedback path comprising a multiplying mapping function, said mapping function being configured to provide an $N_{FB}$-bit feedback signal in accordance with:

$$y_{FB}[n] = \begin{cases} \dfrac{2^{N-1}}{\alpha} & \text{if } y_q[n] = 1 \\ \dfrac{-2^{N-1}}{\alpha} & \text{if } y_q[n] = 0 \end{cases}$$

where $y_{FB}[n]$ is a value of said $N_{FB}$-bit feedback signal at a discrete time n, $y_q[n]$ is a value of said output signal at said discrete time n, and $\alpha$ is a multiplication factor, said feedback signal being combined with an N-bit input signal to provide said feed-forward signal.

9. A delta-sigma converter according to claim 8, wherein $0 < \alpha \leq 1$.

10. A delta-sigma converter according to claim 8, wherein said multiplication factor is a programmable value.

11. A delta-sigma converter according to claim 8, wherein said output signal is a single-bit output signal.

12. A delta-sigma converter according to claim 8, wherein said low pass filter comprises an integrator.

13. A digital-to-analog converter comprising
   a delta-sigma converter configured to provide a digital output signal representative of an N-bit digital input signal multiplied based on at least one multiplication factor; and
   a digital to analog converter for providing an analog output signal representative of said digital output signal.

14. A digital-to-analog converter according to claim 13, wherein said delta-sigma converter comprises:
   a feed-forward path for receiving a feed-forward signal and providing said digital output signal; and
   a feedback path comprising a multiplying mapping function,
   said mapping function being configured to multiply said digital output signal based on said at least one multiplication factor and provide an $N_{FB}$-bit feedback signal representative of said multiplied output signal, said feedback signal being combined with said N-bit digital input signal to provide said feed-forward signal.

15. A digital-to-analog converter according to claim 14, wherein said mapping function is configured to provide said feedback signal in accordance with:

$$y_{FB}[n] = \begin{cases} \dfrac{2^{N-1}}{\alpha} & \text{if } y_q[n] = 1 \\ \dfrac{-2^{N-1}}{\alpha} & \text{if } y_q[n] = 0 \end{cases}$$

where $y_{FB}[n]$ is a value of said $N_{FB}$-bit feedback signal at a discrete time n, $y_q[n]$ is a value of said output signal at said discrete time n, and $\alpha$ is said at least one multiplication factor.

16. A digital-to-analog converter according to claim 15, wherein $0 < \alpha \leq 1$.

17. A digital-to-analog converter according to claim 14, wherein said at least one multiplication factor is a programmable value.

18. A digital-to-analog converter according to claim 14, wherein said feed-forward path comprises a low pass filter and a quantizer, said low pass filter for receiving said feed-forward signal and having an output coupled to an input of said quantizer, said quantizer being configured to provide said output signal.

19. A digital-to-analog converter according to claim 18, wherein said low pass filter comprises an integrator.

20. A digital-to-analog converter according to claim 13, wherein said digital output signal is a single-bit output signal.

21. A digital-to-analog converter according to claim 13, said converter further comprising a low pass filter for receiving said output signal and providing a filtered output signal.

22. A method of multiplying an N-bit digital signal comprising:
   coupling said digital signal to a delta sigma converter, said delta-sigma converter comprising a feed-forward path for receiving a feed-forward signal and providing an output signal, and a feedback path comprising a multiplying mapping function, said mapping function being configured to multiply said output signal based on at least one multiplication factor and provide an $N_{FB}$-bit feedback signal representative of said multiplied output signal, said feedback signal being combined with said digital signal to provide said feed-forward signal.

23. A method according to claim 22, wherein said mapping function is configured to provide said feedback signal in accordance with:

$$y_{FB}[n] = \begin{cases} \dfrac{2^{N-1}}{\alpha} & \text{if } y_q[n] = 1 \\ \dfrac{-2^{N-1}}{\alpha} & \text{if } y_q[n] = 0 \end{cases}$$

where $y_{FB}[n]$ is a value of said $N_{FB}$-bit feedback signal at a discrete time n, $y_q[n]$ is a value of said output signal at said discrete time n, and $\alpha$ is said at least one multiplication factor.

24. A method according to claim 23, wherein $0 < \alpha \leq 1$.

25. A method according to claim 22, wherein said output signal is a single-bit output signal.

26. A method according to claim 22, wherein said at least one multiplication factor is a programmable value.

27. A method according to claim 22, wherein said feed-forward path comprises a low pass filter and a quantizer, said low pass filter for receiving said feed-forward signal and having an output coupled to an input of said quantizer, said quantizer being configured to provide said output signal.

28. A method according to claim 27, wherein said low pass filter comprises an integrator.

* * * * *